(12) United States Patent
Vella-Coleiro

(10) Patent No.: US 7,251,293 B2
(45) Date of Patent: *Jul. 31, 2007

(54) DIGITAL PRE-DISTORTION FOR THE LINEARIZATION OF POWER AMPLIFIERS WITH ASYMMETRICAL CHARACTERISTICS

(75) Inventor: George P. Vella-Coleiro, Summit, NJ (US)

(73) Assignee: Andrew Corporation, Westchester, IL (US)

( * ) Notice: Subject to any disclaimer, the term of this patent is extended or adjusted under 35 U.S.C. 154(b) by 178 days.

This patent is subject to a terminal disclaimer.

(21) Appl. No.: 10/730,419

(22) Filed: Dec. 8, 2003

(65) Prior Publication Data

US 2004/0264597 A1    Dec. 30, 2004

Related U.S. Application Data

(63) Continuation-in-part of application No. 10/607,924, filed on Jun. 27, 2003.

(51) Int. Cl.
H04L 25/49 (2006.01)
H04L 27/36 (2006.01)
H03F 1/26 (2006.01)

(52) U.S. Cl. .................... 375/297; 375/296; 330/149; 455/114.3

(58) Field of Classification Search ................ 375/254, 375/285, 296, 297; 381/94.1; 330/149; 455/501, 63.1, 114.2, 114.3
See application file for complete search history.

(56) References Cited

U.S. PATENT DOCUMENTS 4,870,371 A    9/1989  Gottwald et al.
4,890,300 A    12/1989 Andrews ..................... 375/60

(Continued)

FOREIGN PATENT DOCUMENTS

EP    0 416 622 A2    3/1991

(Continued)

OTHER PUBLICATIONS

"An Efficient Adaptive Predistorter for Nonlinear High Power Amplifier in Satellite Communication", by Kang H.W. et al., 1997 IEEE International Symposium on Circuits and Systems, Jun. 9-12, 1997, pp. 228-2291, XP-0000804798, New York.

(Continued)

Primary Examiner—Young T. Tse
(74) Attorney, Agent, or Firm—Steve Mendelsohn

(57) ABSTRACT

An input signal is pre-distorted to reduce spurious emissions resulting from subsequent signal amplification. Frequency-dependent pre-distortion is preferably implemented in combination with frequency-independent pre-distortion, where the frequency-dependent pre-distortion corresponds to amplifier distortion that has a magnitude that is proportional to the frequency offset from the carrier frequency and a ±90° phase shift on either side of the carrier frequency. The frequency-dependent pre-distortion is generated by differentiating waveforms corresponding to two different sets of pre-distortion parameters with respect to time. In one embodiment, one of the differentiated waveforms is applied to a positive-frequency filter and the other to a negative-frequency filter to generate positive- and negative-frequency pre-distortion signals, respectively, to account for asymmetries in the amplifier characteristics. In another embodiment, only one of the differentiated waveforms is applied to an asymmetric filter (i.e., either a positive-frequency filter or a negative-frequency filter).

21 Claims, 9 Drawing Sheets

U.S. PATENT DOCUMENTS

| | | | |
|---|---|---|---|
| 5,132,639 A * | 7/1992 | Blauvelt et al. | 330/149 |
| 5,187,719 A | 2/1993 | Birgenheier et al. | 375/10 |
| 5,361,156 A | 11/1994 | Pidgeon | 359/161 |
| 5,872,814 A | 2/1999 | McMeekin | 375/296 |
| 5,937,011 A | 8/1999 | Carney et al. | 375/297 |
| 6,075,411 A | 6/2000 | Briffa et al. | 330/149 |
| 6,081,158 A | 6/2000 | Twitchell et al. | 330/149 |
| 6,091,941 A | 7/2000 | Moriyama et al. | 455/126 |
| 6,112,062 A | 8/2000 | Hans et al. | |
| 6,141,390 A | 10/2000 | Cova | 375/297 |
| 6,166,603 A | 12/2000 | Smith | 330/263 |
| 6,194,942 B1 * | 2/2001 | Yu et al. | 327/317 |
| 6,236,267 B1 | 5/2001 | Anzil | 330/149 |
| 6,271,724 B1 | 8/2001 | Neffling | 330/149 |
| 6,275,103 B1 | 8/2001 | Maniwa | 330/149 |
| 6,281,747 B2 | 8/2001 | Ahuja et al. | 330/109 |
| 6,288,610 B1 | 9/2001 | Miyashita | 330/149 |
| 6,288,814 B1 | 9/2001 | Blauvelt | 359/180 |
| 6,304,140 B1 | 10/2001 | Thron et al. | 330/149 |
| 6,342,810 B1 | 1/2002 | Wright et al. | 330/51 |
| 6,366,177 B1 | 4/2002 | McCune et al. | 332/103 |
| 6,373,902 B1 | 4/2002 | Park et al. | 375/296 |
| 6,400,415 B1 | 6/2002 | Danielsons | 348/608 |
| 6,417,731 B1 | 7/2002 | Funada et al. | 330/149 |
| 6,429,736 B1 | 8/2002 | Parry et al. | 330/2 |
| 6,438,186 B1 | 8/2002 | Strait | 375/354 |
| 6,489,846 B2 * | 12/2002 | Hatsugai | 330/149 |
| 6,512,417 B2 | 1/2003 | Booth et al. | 330/149 |
| 6,587,514 B1 | 7/2003 | Wright et al. | |
| 6,677,820 B2 * | 1/2004 | Miyatani | 330/149 |
| 6,683,495 B2 * | 1/2004 | Johnson et al. | 330/52 |
| 6,687,511 B2 * | 2/2004 | McGowan et al. | 455/522 |
| 6,700,442 B2 * | 3/2004 | Ha | 330/124 R |
| 6,794,936 B2 | 9/2004 | Hsu et al. | 330/149 |
| 6,798,843 B1 * | 9/2004 | Wright et al. | 375/296 |
| 6,885,709 B1 | 4/2005 | Dartois | 375/297 |
| 6,903,604 B2 | 6/2005 | Kim | 330/2 |
| 6,925,106 B2 * | 8/2005 | Horaguchi et al. | 375/146 |
| 6,975,687 B2 | 12/2005 | Jackson et al. | 375/297 |
| 2001/0033238 A1 | 10/2001 | Velazquez | |
| 2002/0041210 A1 | 4/2002 | Booth et al. | 330/149 |
| 2002/0060606 A1 | 5/2002 | Andre | 330/149 |
| 2002/0065048 A1 | 5/2002 | Nagatani et al. | 455/63 |
| 2002/0080891 A1 | 6/2002 | Ahn et al. | 375/297 |
| 2002/0085647 A1 | 7/2002 | Oishi et al. | 375/297 |
| 2002/0125947 A1 | 9/2002 | Ren | 330/149 |
| 2002/0171485 A1 * | 11/2002 | Cova | 330/149 |
| 2002/0186783 A1 | 12/2002 | Opas et al. | 375/297 |
| 2003/0016741 A1 | 1/2003 | Sasson et al. | 375/229 |
| 2003/0020538 A1 | 1/2003 | Kim | 330/2 |
| 2003/0045264 A1 | 3/2003 | Jeong et al. | 455/323 |
| 2003/0058960 A1 | 3/2003 | Lee | 375/297 |
| 2003/0076894 A1 | 4/2003 | Jin et al. | 375/296 |
| 2003/0076896 A1 | 4/2003 | Ball et al. | 375/297 |
| 2003/0117215 A1 | 6/2003 | O'Flaherty et al. | 330/149 |
| 2003/0227981 A1 | 12/2003 | Vella-Coleiro et al. | 375/297 |
| 2004/0041628 A1 | 3/2004 | Okubo et al. | 330/149 |
| 2004/0122627 A1 | 6/2004 | Kybett et al. | 702/189 |
| 2004/0264597 A1 | 12/2004 | Vella-Coleiro | 375/297 |
| 2005/0088230 A1 | 4/2005 | Johnson et al. | 330/149 |

FOREIGN PATENT DOCUMENTS

| | | |
|---|---|---|
| EP | 1 085 668 A2 | 3/2001 |
| EP | 1 199 797 A1 | 4/2002 |
| EP | 1 280 273 A2 | 1/2003 |
| EP | 1 463 198 A2 | 9/2004 |
| GB | 2 348 755 A | 10/2000 |
| GB | 2 384 377 A | 7/2003 |
| WO | WO 03/085822 A1 | 10/2003 |

OTHER PUBLICATIONS

"Communication Systems—Third Edition", by Carlson A.B., 1986, McGraw-Hill, Singapore XP-002245318; pp. 194-200.

"A simplex method for function minimization", J.A. Nelder and R. Mead, Computer Journal, vol. 7 (1965), pp. 308-313.

* cited by examiner

DIGITAL PRE-DISTORTION FOR THE LINEARIZATION OF POWER AMPLIFIERS WITH ASYMMETRICAL CHARACTERISTICS

CROSS-REFERENCE TO RELATED APPLICATIONS

This is a continuation-in-part of co-pending application Ser. No. 10/607,924, filed on Jun. 27, 2003, the teachings of which are incorporated herein by reference.

The subject matter of this application is also related to the subject matter of (a) U.S. patent application Ser. No. 09/395,490, filed on Sep. 14, 1999 ("the '490 application"), (b) U.S. patent application Ser. No. 10/068,343, filed on Feb. 5, 2002, (c) U.S. patent application Ser. No. 10/153,446, filed on May 22, 2002 ("the '446 application"), (d) U.S. patent application Ser. No. 10/153,289, filed on May 22, 2002 ("the '289 application"), and (e) U.S. patent application Ser. No. 10/217,930, filed on Aug. 13, 2002, the teachings of all five of which are incorporated herein by reference.

FIELD OF THE INVENTION

The present invention relates to signal processing, and, in particular, to the pre-distortion of signals for transmission, for example, in a wireless communication network, to reduce spurious emissions.

BACKGROUND OF THE INVENTION

Modern wireless communication networks employ complex modulation schemes that necessitate tight control of spurious emissions (sometimes called "out-of-band emissions") in order to avoid interfering with neighboring carriers and to comply with the requirements of regulatory bodies (e.g., FCC) and standards bodies (e.g. ITU). One source of spurious emissions is the base station transmitter amplifier that is used to amplify signals prior to transmission as wireless (e.g., RF) signals to wireless (e.g., mobile) units in a wireless communication network, such as a cellular voice and/or data network. Prior art techniques for reducing such spurious emissions were able to satisfy previous requirements. However, recent developments in wireless communication networks (e.g., Universal Mobile Telecommunication Service (UMTS)) place additional burden on the base station transmitter amplifier and make it advantageous to reduce the spurious emissions even further.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Embodiments of the present invention are directed to techniques that reduce spurious emissions in wireless communication networks to levels that satisfy current requirements. In particular, embodiments of the present invention involve the application of pre-distortion to an input signal to generate a pre-distorted signal that, when applied, e.g., to an amplifier, results in lower spurious emissions in the resulting amplified signal, where the amplifier has asymmetrical characteristics (e.g., an asymmetry between spurious emissions that occur at frequencies below the center frequency and spurious emissions that occur at frequencies above the center frequency).

Pre-Distortion Technique of the '490 Application

The '490 application describes a technique for reducing spurious emissions using digital pre-distortion that was sufficient to meet previously existing regulations and standards. According to the '490 application, pre-distortion, whose magnitude and phase are frequency-independent, is applied to an input signal to generate a (main) pre-distorted signal that reduces spurious emissions when the pre-distorted signal is subsequently amplified by an amplifier. According to embodiments of the '289 and '446 applications, pre-distortion, whose magnitude—and preferably phase—are frequency-dependent, is applied to generate an additional (i.e., secondary) pre-distortion signal that, when combined with the main pre-distorted signal described in the '490 application, can further reduce spurious emissions in the amplified signal. The following section provides a description of the pre-distortion technique taught in the '490 application. Following that is a description of different possible implementations of a pre-distortion component, whose magnitude and phase are frequency-dependent, that is preferably combined with—but does not necessarily have to be combined with—the pre-distortion technique of the '490 application to further reduce spurious emissions in communications networks.

The pre-distortion technique described in the '490 application reduces adjacent channel power in wireless communication networks. In particular, the '490 application describes a technique for digitally and adaptively pre-distorting an outgoing signal that involves applying a correction to the signal before it is applied, e.g., to the input of a base station transmitter amplifier, such that the correction is equal and opposite to at least some of the anticipated distortion produced by the amplifier. The correction causes at least some of the amplifier distortion to be canceled, resulting in a base station transmitter having a more linear transfer characteristic than a corresponding transmitter without such pre-distortion. In these circumstances, the adjacent channel power (i.e., spurious emission) is desirably reduced.

Figure 1:
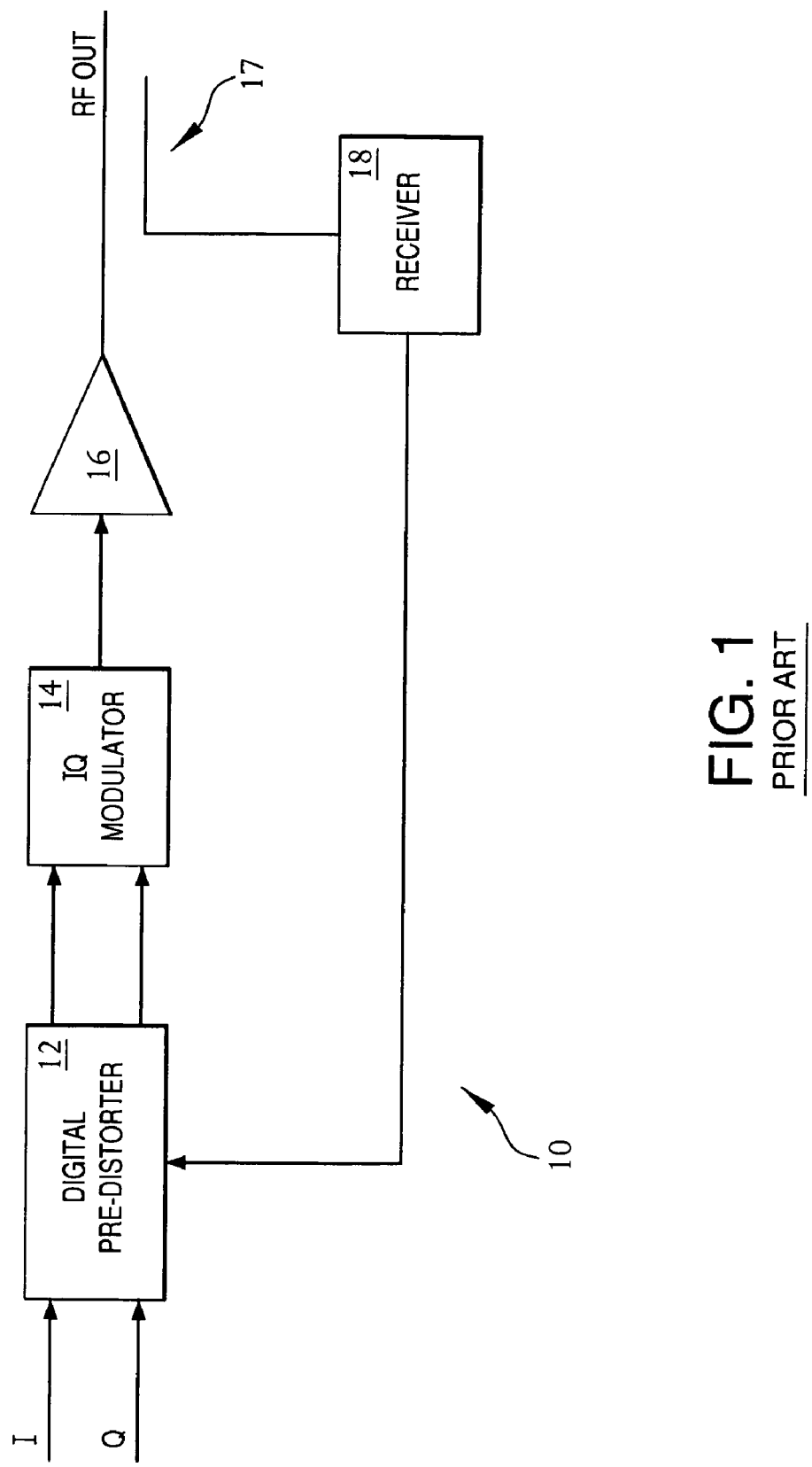
FIG. 1 shows a block diagram of a system, in accordance with the (frequency-independent) pre-distortion technique described in the U.S. application Ser. No. 09/395,490.

FIG. 1 shows a block diagram of a system 10, in accordance with the pre-distortion technique described in the '490 application. System 10 includes a digital pre-distorter 12 for receiving the in-phase (I) and quadrature (Q) components of an input digital baseband signal, an IQ modulator 14 connected to the output of pre-distorter 12, an amplifier 16 connected to the output of modulator 14, and a receiver 18 that is coupled to the output of amplifier 16 through a coupler 17 in order to generate a control signal that is fed back to pre-distorter 12. These components are configured to apply a correction to the input digital baseband signal (e.g., a code division multiple access (CDMA) signal, a wideband CDMA signal, a time division multiple access (TDMA) signal, an enhanced data rates through global system for mobile communications evolution (EDGE) signal, or other signal, preferably with a substantially large peak power to average power ratio) generated by a communication device—such as a base station used for transmitting wireless communication data—and applied to pre-distorter 12 as the input signal (I, Q). System 10 also provides adaptive feedback through receiver 18 to optimize the correction.

More specifically, this pre-distortion technique comprises applying a correction to a digital baseband signal before the signal is applied to an input of amplifier 16 such that the correction is opposite to at least a portion of the distortion produced by amplifier 16. Thus, the correction and some portion of the amplifier distortion cancel one another, resulting in a system with a more linear transfer characteristic. In system 10, in order to take advantage of the precision and low cost of digital circuits, digital pre-distorter 12 preferably performs its correction at baseband, before the signal is converted by modulator 14 to radio frequency (RF) for amplification and transmission.

According to this pre-distortion technique, pre-distorter 12 pre-distorts both the magnitude and the phase of the input signal as a function of the signal power (but independent of frequency). Since both the magnitude and phase corrections vary with the instantaneous power (i.e., envelope power), pre-distorter 12 relies on accurate descriptions of the amplifier magnitude and phase variations with power level to perform its function. As will be described below, the functional representation of the corrections (versus power level) are in the form of polynomial equations from which a look-up table is preferably derived.

More particularly, the digital baseband signal is comprised of discrete time samples of in-phase (I) and quadrature (Q) components which, after digital-to-analog conversion (not shown), are applied to the vector IQ modulator 14 to generate an RF signal that is then input to amplifier 16. Each sample for the baseband signal can be represented in complex number notation as (I+jQ), where j is the square root of (−1). The pre-distortion operation of pre-distorter 12 can be represented according to Equations (1)-(3) as follows:

$$I'+jQ'=(I+jQ)(A+jB) \quad (1)$$

where $$I'=IA-QB \quad (2)$$

$$Q'=QA+IB \quad (3)$$

where I' and Q' are the pre-distorted in-phase and quadrature baseband signals generated by pre-distorter 12, and A and B are pre-distortion parameters that are a function of the instantaneous envelope power of the input signal represented by I and Q. Conveniently, different values for parameters A and B may be stored in a look-up table (which is generated as described below) with the index being the instantaneous envelope power given by ($I^2+Q^2$).

Figure 2:
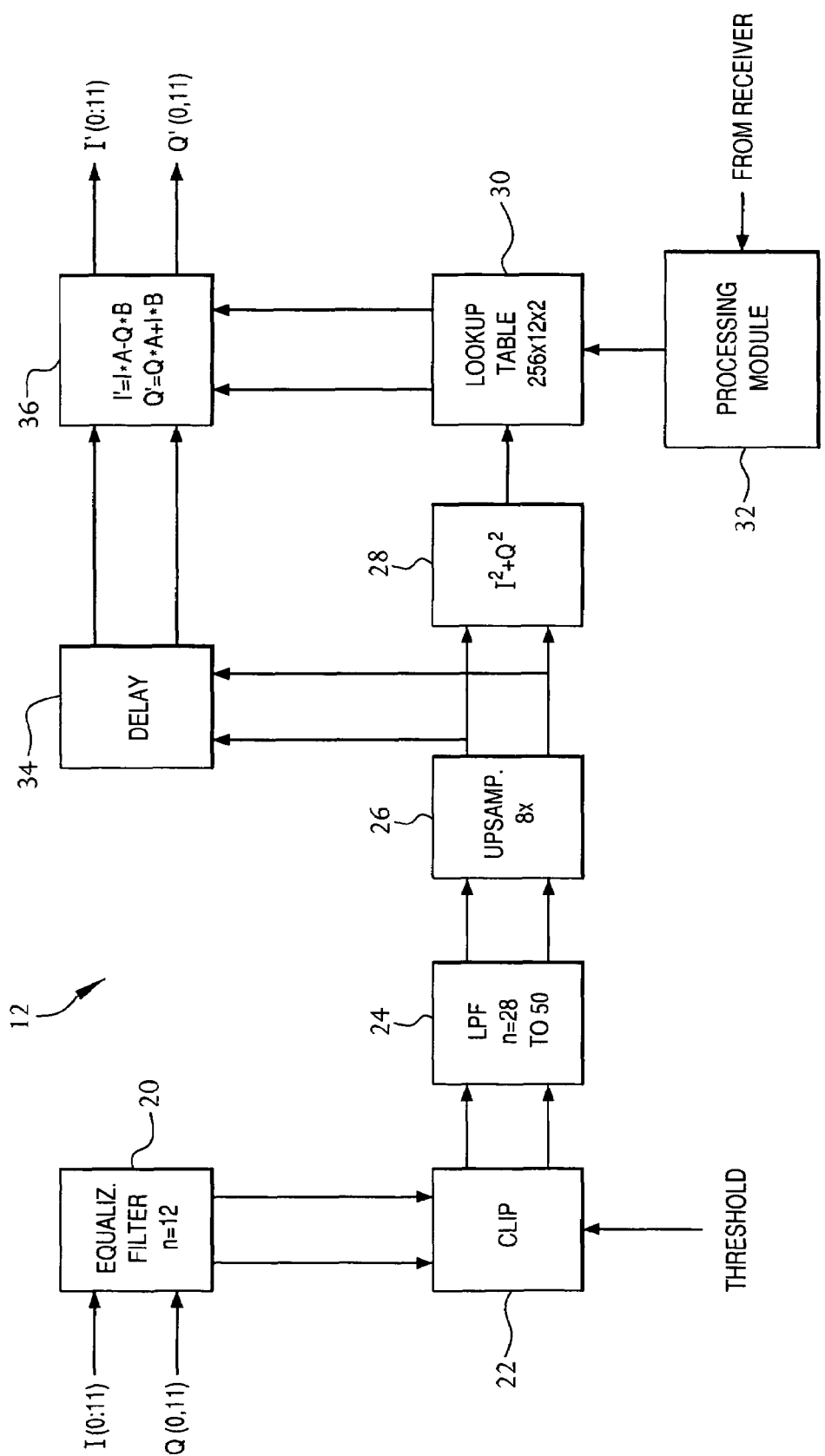
FIG. 2 shows a block diagram of the digital pre-distorter of FIG. 1.

FIG. 2 shows a block diagram of digital pre-distorter 12 of FIG. 1, in accordance with the pre-distortion technique of the '490 application. As shown in FIG. 2, pre-distorter 12 includes an equalization filter 20 for receiving the signal that is comprised of the in-phase and quadrature components described above. The equalization filter is a component that is well known in the art and is operatively connected to a clipping module 22 that clips the signal to a predetermined threshold. The output of clipping module 22 is fed to a low-pass filter 24 that eliminates the high-frequency components that are generated during clipping.

The output of low-pass filter 24 is fed to a sampling module 26 that provides an up-sampled signal (e.g., increases the sampling rate by a factor of four from an original 2× rate to an 8× rate) to an index calculating module 28, which calculates an index value based on the sum of the squares of the in-phase and quadrature components of the baseband signal. Index calculating module 28 is connected to a look-up table 30 having stored therein parameters A and B. Values for parameters A and B are retrieved based on the calculated index value.

The pre-distortion parameters A and B of look-up table 30 are derived from a set of polynomial equations that closely approximate the corrections used to linearize the amplifier characteristics. Because of the complex nature of the characteristics of amplifiers, such as class AB amplifiers, advantageous results are obtained by using a pair of polynomial equations for parameter B, while a single polynomial equation is sufficient for parameter A. (As an approximation, it can be said that parameter A corrects the magnitude distortion of the amplifier, while parameter B corrects the phase distortion.) These polynomial equations can be written according to Equations (4)-(7) as follows:

$$A=C_0+C_1P+C_2P^2+C_3P^3 \text{ for } A \leq A_m \quad (4)$$

$$A=A_m \text{ otherwise} \quad (5)$$

$$B=C_4P+C_5P^2+C_6P^3 \text{ for } P \leq P_b \quad (6)$$

$$B=(B_{b1}-B_{b2})+C_7P+C_8P^2+C_9P^3 \text{ for } P>P_b \quad (7)$$

where $P=(I^2+Q^2)$ is the instantaneous envelope power. $A_m$ is a maximum value imposed on parameter A to prevent the amplifier from being driven deep into saturation. A typical value for $A_m$ is 2, but it can vary depending on the detailed design. $P_b$ is a breakpoint where parameter B transitions between Equations (6) and (7). $P_b$ is an optimizable parameter whose value is obtained by the optimization algorithm. The value varies from amplifier to amplifier. It can also vary with temperature. $B_{b1}$ and $B_{b2}$ are the values of parameter B at $P=P_b$ using Equations (6) and (7), respectively. The first term on the right-hand side of Equation (7) is intended to make Equations (6) and (7) continuous at $P=P_b$. $C_0$ through $C_9$ are coefficients that pertain to the transfer function characteristics of a particular amplifier and which can vary with temperature, aging of the amplifier components, etc. As with $P_b$, the optimization algorithm finds values for coefficients $C_0$ through $C_9$ that give optimized results.

Of course, it should be appreciated that, in appropriate circumstances, two polynomial equations may be used for parameter A as well as for parameter B. Furthermore, in many instances it is possible to reduce Equations (4) and (6)

to exclude terms higher than the linear P term, resulting in Equations (4')-(7') as follows:

$$A = C_0 + C_1 P \text{ for } P \leq P_b \quad (4')$$

$$A = (A_{b1} - A_{b2}) + C_2 P + C_3 P^2 + C_4 P^3 \text{ for } P > P_b \quad (5')$$

$$B = C_5 P \text{ for } P \leq P_b \quad (6')$$

$$B = (B_{b1} - B_{b2}) + C_6 P + C_7 P^2 + C_8 P^3 \text{ for } P > P_b \quad (7')$$

where $A_{b1}$ and $A_{b2}$ are the values of parameter A at $P=P_b$ using Equations (4') and (5'), respective. As before, a maximum limit $A_m$ can be placed on the value of parameter A. Also, if necessary, the breakpoint $P_b$ where the transition is made from one polynomial equation to the other can have a different value for the A equations than for the B equations.

To accommodate the time-varying nature of the coefficients (e.g., $C_0$-$C_9$ in Equations (4)-(7)), an adaptive scheme is employed in this pre-distortion technique whereby the values of the coefficients are at least intermittently optimized (or operated on) to maintain minimum or reduced spurious emissions. Referring again to FIG. 1, coupler 17 at the output of amplifier 16 samples the output and receiver 18, which is tuned to the frequency region where the spurious emissions are to be reduced or minimized, generates a voltage proportional to the received power. Multiple receivers can be used to sample the spurious emissions at more than one frequency or a single receiver can tune sequentially to the different frequencies of interest. The voltages obtained at the different frequencies are then combined into a single quantity whose value is to be reduced or minimized. When two frequencies are used, which is generally sufficient, the resultant voltages, $V_1$ and $V_2$, can be combined according to Equation (8) as follows:

$$V = V_1 + V_2 + |(V_1 - V_2)| \quad (8)$$

where $|(V_1-V_2)|$ is the absolute value of $(V_1-V_2)$. Such use of an absolute value causes both $V_1$ and $V_2$ to be reduced or minimized, instead of simply providing the sum of the two values. If only the first two terms on the right-hand side of Equation (8) were used, the algorithm might find a false optimum by making one voltage very small and the other quite large. An alternative to Equation (8) is $V=\max(V_1, V_2)$, where max means choose the larger of the values.

A suitable algorithm to find the values of the coefficients that reduce or minimize V, and thus the spurious emissions, is the well-known simplex algorithm, described by Nelder and Mead in "A Simplex Method For Function Minimization," Computer Journal, Vol. 7, pp. 308-313 (1965), which is incorporated herein by reference. As will be described below, the algorithm is implemented in modified form.

Referring again to FIG. 2, based on the feed-back signal from receiver 18 of FIG. 1, processing module 32 implements the modified simplex algorithm to update the values of parameters A and B stored in look-up table 30. It should be appreciated that processing module 32 may take a variety of forms such as a microprocessor, a digital signal processor, or a processing circuit using FPGA devices. It should be further appreciated that the simplex algorithm may be implemented in any suitable manner that utilizes appropriate combinations of hardware and software that will be apparent to those of skill in the art upon a reading hereof. Of course, the device used to implement the algorithm (here, module 32) should include suitable storage capacity to store and maintain the code and data necessary to run the algorithm.

At each iteration, the values of the coefficients derived by the algorithm are used in the equations for A and B described above to generate a table which is used by the algorithm for the next iteration. The algorithm is allowed to run continuously, or at least intermittently, so that the coefficient values track changes that occur over time.

The simplex optimization algorithm as developed by Nelder and Mead was intended for minimizing or reducing function values, which were obtained by mathematical computations. An important aspect of this mode of operation is that, if a computation is repeated, the same function value is obtained. This contrasts with values obtained by measurements on operating hardware where noise and fluctuations inevitably result in varying measured values. This difference has an important consequence when an attempt is made to use the simplex algorithm in real time on operating hardware.

The essence of the simplex algorithm is that, at each iteration, the set of coefficients that is associated with the worst function value is replaced with a new set which gives a better function value. This new value might or might not be better than the best function value obtained up to that time, but as the algorithm progresses it is expected that better and better function values will be obtained. Suppose that, as a result of noise and fluctuations in the measurements, an exceptionally good but erroneous value is obtained. If subsequent values obtained are all worse than this erroneous value, then the algorithm will converge on the erroneous value. Thus, in its conventional form, the algorithm is not very suitable for use in situations where considerable fluctuations exist in the quantity being optimized or operated on as may be in the present case.

To circumvent this difficulty, the simplex algorithm is used in modified form. At the end of each iteration, if the previous best value is replaced by a better value, then the algorithm proceeds to the next iteration. However, if an iteration does not yield a new best value, then the existing best point is re-evaluated and the new value is substituted for the previous one. Thus, the algorithm is able to recover from erroneous data due to fluctuating measurements. These fluctuations may result in a larger number of iterations in order to reach a desired point (which could be an optimum point), but will not prevent the desired point from being reached.

Another modification of the simplex algorithm enables it to operate continuously to track changes in amplifier characteristics caused by temperature changes, aging of components, or other disturbances. In the conventional implementation of the algorithm, an exit criterion is established (the criterion is usually related to the fractional variation of the function values between the worst and best points of the simplex) and the algorithm terminates when the criterion is satisfied. As the desired or optimum point is approached, the algorithm reduces the size of the simplex which typically becomes very small by the time the desired point is reached. Once this happens, the algorithm is no longer able to react to changes in amplifier characteristics.

In preferred implementations, the size of the simplex is prevented from becoming too small by comparing it to a value, such as a preset minimum value, at the start of each iteration and increasing the size to the value if it has been reduced below it. The value is chosen such that it is large enough to enable the algorithm to track changes in the amplifier characteristics but not so large that the desired (or optimum) point cannot be reached. A suitable value is one where the value of each coefficient at the worst point of the simplex differs from the corresponding value at the best point by 5 to 10 percent.

With continuing reference to FIG. 2, the output of sampling module 26 is also connected to a delay circuit 34, which is, in turn, connected to an output module 36 that generates an output signal based on the values of parameters A and B retrieved from look-up table 30 and the delayed upsampled signal from delay circuit 34. The delay applied by delay circuit 34 is preferably equivalent to the delay involved in performing the processing of modules 28 and 30 so that the appropriate values of (I and Q) and (A and B) arrive at output module 36 at the same time.

Figure 3:
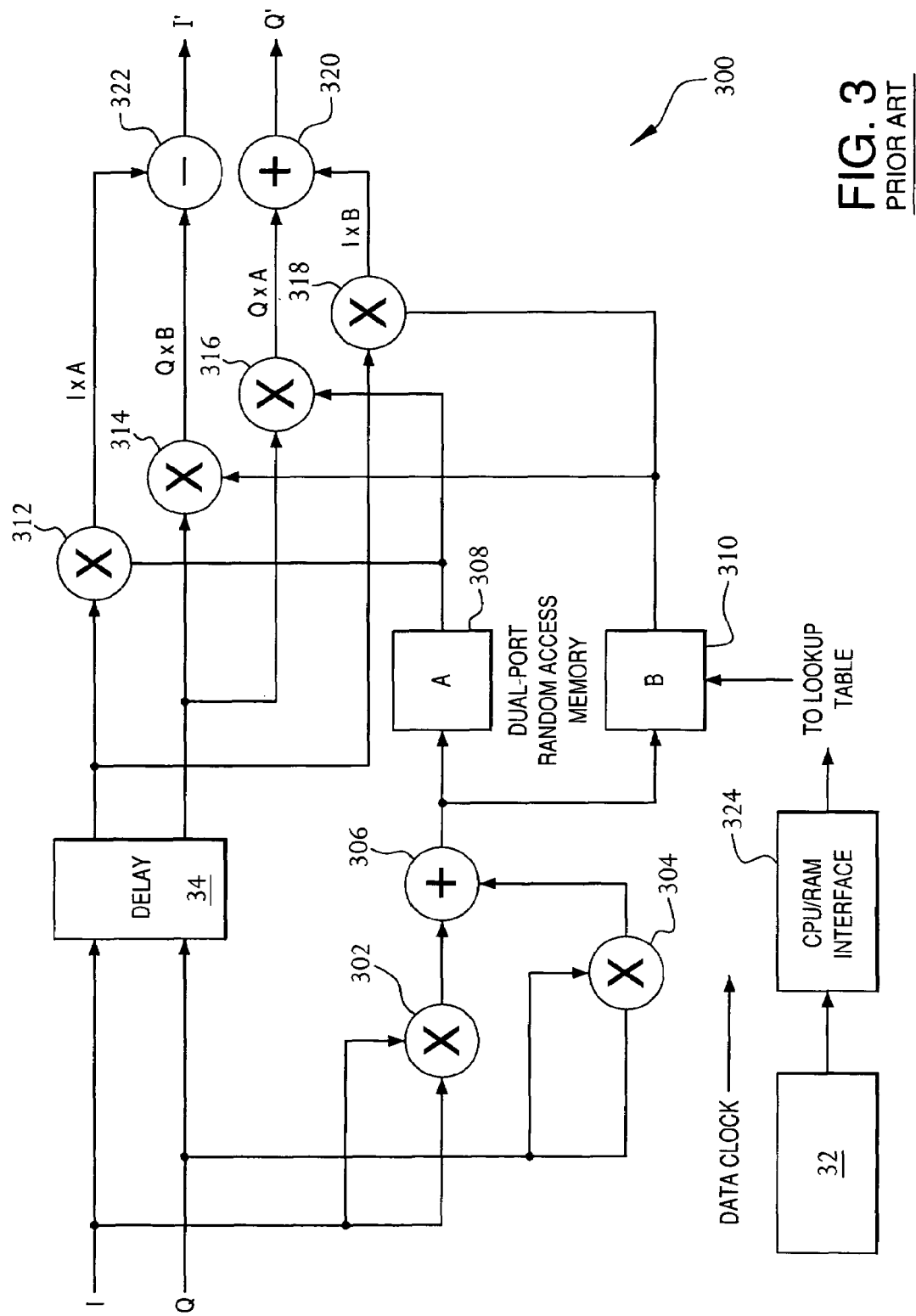
FIG. 3 shows a block diagram of an exemplary FPGA implementation of the index calculating module, the delay block, the look-up table, and the output module of FIG. 2.

FIG. 3 shows a block diagram of an exemplary FPGA implementation 300 of index calculating module 28, delay 34, look-up table 30, and output module 36 of FIG. 2. The I and Q data paths are independently squared at multipliers 302 and 304 to create $I^2$ and $Q^2$, respectively. These two values are added together at adder block 306 to form an index address for look-up table 30, which, in FIG. 3, takes the form of two separate dual-port RAM memory blocks 308 and 310, which contain the parameters A and B, respectively. The parameters output from the memory blocks are multiplied by the delayed I and Q values at multipliers 312, 314, 316, and 318 to create the four values I×A, I×B, Q×A, and Q×B. These are combined by adder and subtractor blocks 320 and 322 to form (IA−QB) and (QA+IB), respectively, which are output as I' and Q'.

Additional circuitry 324 loads the dual-port memory blocks 308 and 310 with parameter data generated in processing module 32 using standard memory interface signals. The use of dual-port memory permits real-time updating of the look-up tables without disrupting the accessing of parameter values by the pre-distortion process.

A look-up table configuration is not necessary where, for example, the processing module has a sufficiently high processing speed to allow for the obtaining of the A and B parameters on an "as needed" basis. In this case, the processing module calculates the appropriate coefficients and the A and B parameters are subsequently calculated by the processing module as needed or desired without storing such parameters in a look-up table.

Referring again to FIG. 1, receiver 18 in the digital pre-distortion adaptive feedback loop is used to measure the RF power over a narrow bandwidth at a specific frequency. This tuned frequency is offset from, for example, the main CDMA carrier frequency and is a frequency where the spurious emissions are to be minimized by the optimization algorithm.

Figure 4:
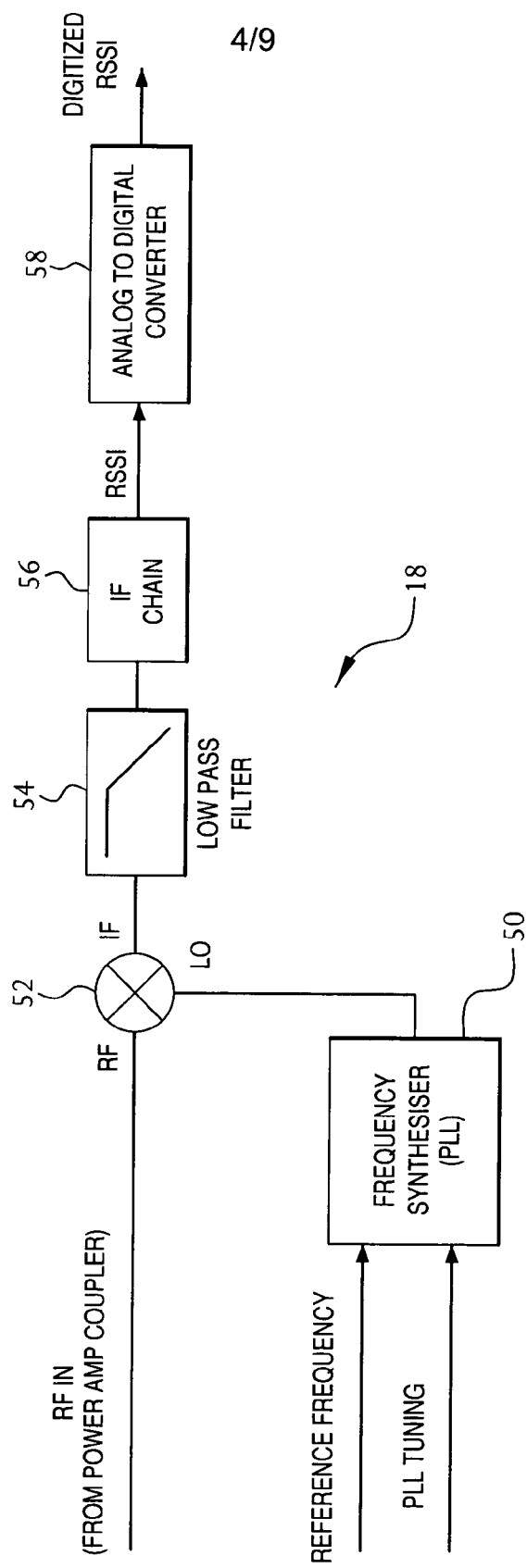
FIG. 4 shows a block diagram of an exemplary single-channel, single-conversion implementation of the receiver of FIG. 1.

FIG. 4 shows a block diagram of an exemplary single-channel, single-conversion implementation of receiver 18 of FIG. 1. In this implementation, receiver 18 includes a frequency synthesizer 50, which is connected to a mixer 52. The output of mixer 52 is connected to a low-pass filter 54, which in turn is connected to an intermediate frequency (IF) chain 56. The output of IF chain 56 is connected to an analog-to-digital converter (ADC) 58, which then provides input to processing module 32 of FIG. 2. Three important frequencies in FIG. 4 are the RF frequency where the adjacent power level is to be measured, the local oscillator (LO) frequency which is varied as needed to tune the receiver, and intermediate frequency (IF) which is fixed. The LO frequency is found by LO=RF−IF.

More particularly, as shown in FIG. 1, the RF input of receiver 18 is coupled off the output of power amplifier 16 by coupler 17. This wide-band RF signal is down-converted to an intermediate frequency (IF) at mixer 52, where IF=RF−LO. The LO frequency for mixer 52 is generated by a phase-locked loop (PLL) frequency synthesizer 50. This LO frequency is set by (digital) tuning commands from a microprocessor (e.g., processing module 32 of FIG. 2).

Low-pass filter 54 is used to filter the RF+LO frequency products, as well as the RF and LO feed-through, and any higher frequency products produced by mixer 52. The receiver IF chain 56 is shown as a single block in FIG. 4. In one implementation, IF chain 56 actually includes amplifiers and a narrow bandpass filter, which assures that the power being measured is truly the power at the tuned frequency and does not contain power from, for example, the main CDMA carrier. IF chain 56 produces a Received Signal Strength Indicator (RSSI) voltage output that is proportional to the IF power, which in turn is proportional to the RF power. The RSSI voltage is sampled by ADC 58, where the resulting digitized RSSI is a digital word (which represents the power level at the tuned frequency) that is used by the optimization algorithm implemented by processing module 32 of FIG. 2.

In some implementations, the optimization algorithm monitors the spurious emissions at multiple frequency points, in which case, the single-channel receiver of FIG. 4 may be re-tuned for each different frequency. This re-tuning can be done with a procedure similar to the following:

A microprocessor (e.g., processing module 32) sends a tuning command to the frequency synthesizer to set the LO frequency (and therefore the receiver's tuned frequency).

The microprocessor waits for the PLL and RSSI to settle.

The digitized RSSI value is read by the microprocessor. Multiple readings could be taken if an average RSSI is used.

These steps are repeated for the next frequency.

The pre-distortion technique of the '490 application was designed to correct for at least some of the non-linearities of the amplifier by pre-distorting both the magnitude of the baseband signal (primarily achieved using the parameter A) as well as the phase (primarily achieved using the parameter B). There are, however, applications where the characteristics of the signal (ratio of peak power to average power close to 1, as in a single-channel TDMA system) do not allow substantial expansion of the magnitude so that the magnitude non-linearity of the amplifier cannot be corrected as fully as might be desired. In these applications substantial improvement can be obtained by correcting the phase as much as possible (via the parameter B) and correcting the magnitude partially by appropriate setting of the $A_m$ value.

Frequency-Dependent Magnitude and Phase Pre-Distortion

As described in the previous section, the pre-distortion technique of the '490 application can be used to achieve a substantial reduction in spurious emissions, but it is frequently observed that some residual spurious emissions are still present. Attempts to reduce these residual spurious emissions by modifying the coefficients in Equations (4) to (7) (or in Equation (4') to (7')) result in an asymmetrical situation where a reduction in the spurious emissions on the low-frequency side of a communication channel are accompanied by an increase in the spurious emissions on the high-frequency side of the channel, and vice-versa, resulting in an overall degradation—or at least no overall improvement—in performance.

According to embodiments of the '289 and '446 applications, in order to reduce the spurious emissions to a level lower than that achieved by the (frequency-independent)

pre-distortion technique of the '490 application, pre-distortion, whose magnitude and phase are frequency-dependent, is also applied.

The distortion caused by an amplifier can be considered to be made up of two parts. The first part, which is independent of the signal bandwidth and which is addressed by the '490 application (and other conventional frequency-independent pre-distortion techniques), is associated with the curvature of the amplifier's transfer function which leads to AM-AM (amplitude to amplitude) and AM-PM (amplitude to phase) type of distortions. The pre-distortion of the '490 application effectively deals with this part of the amplifier's distortion by correcting the curvature of the transfer function.

The second part of the amplifier distortion is negligible for narrow bandwidth signals, but it becomes increasingly important as the bandwidth increases. This part of the amplifier distortion has a magnitude that is proportional to the frequency offset from the carrier frequency and a phase shift of ±90° on either side of the carrier frequency. Since these characteristics match those of a differentiator, a correction of this part of the amplifier's distortion can be achieved using a differentiating filter circuit.

The combination of the two corrections can be expressed by Equation (9) as follows:

$$I'+jQ'=(I+jQ)(A+jB)+d\{(I+jQ)(X+jY)\}/dt \quad (9)$$

where I and Q are the in-phase and quadrature components of the input signal before pre-distortion, I' and Q' are the corresponding components after pre-distortion, j is the square root of −1, and A, B, X, and Y, which are functions of the instantaneous power P ($P=I^2+Q^2$), are pre-distortion parameters. The symbol d/dt represents differentiation with respect to time. The first term on the right hand side of Equation (9) represents the bandwidth-independent part of the pre-distortion, while the second term represents the bandwidth-dependent part.

According to embodiments of the present invention, Equation (9) is replaced by Equation (10) as follows:

$$I'+jQ'=(I+jQ)(A+jB)+P[d\{(I+jQ)(T+jU)\}/dt]+ \\ N[d\{(I+jQ)(V+jW)\}/dt] \quad (10)$$

where T, U, V, and W are functions of the power P, P represents an operation (e.g., a filter) that passes only the positive frequency components of the spectrum, and N represents an analogous operation that passes only the negative frequency components of the spectrum. (In this specification, positive and negative frequencies refer to the baseband representation of the signal. In non-baseband domains (e.g., RF), positive frequencies are greater than the center frequency, and negative frequencies are smaller than the center frequency.) By separating the positive frequencies from the negative frequencies and using different functions of the power P (i.e., T and U for the positive frequencies and V and W for the negative frequencies), it is possible to accommodate in a straightforward manner asymmetries in the amplifier characteristics that would otherwise be difficult to correct.

Depending on the implementation, the P and N operations can be accomplished in a variety of ways including using Fourier transforms, Hilbert transforms, or filters. Filters are the preferred implementation, since they are well suited for incorporation in an FPGA (field-programmable gate array) or ASIC (application-specific integrated circuit).

Figure 5:
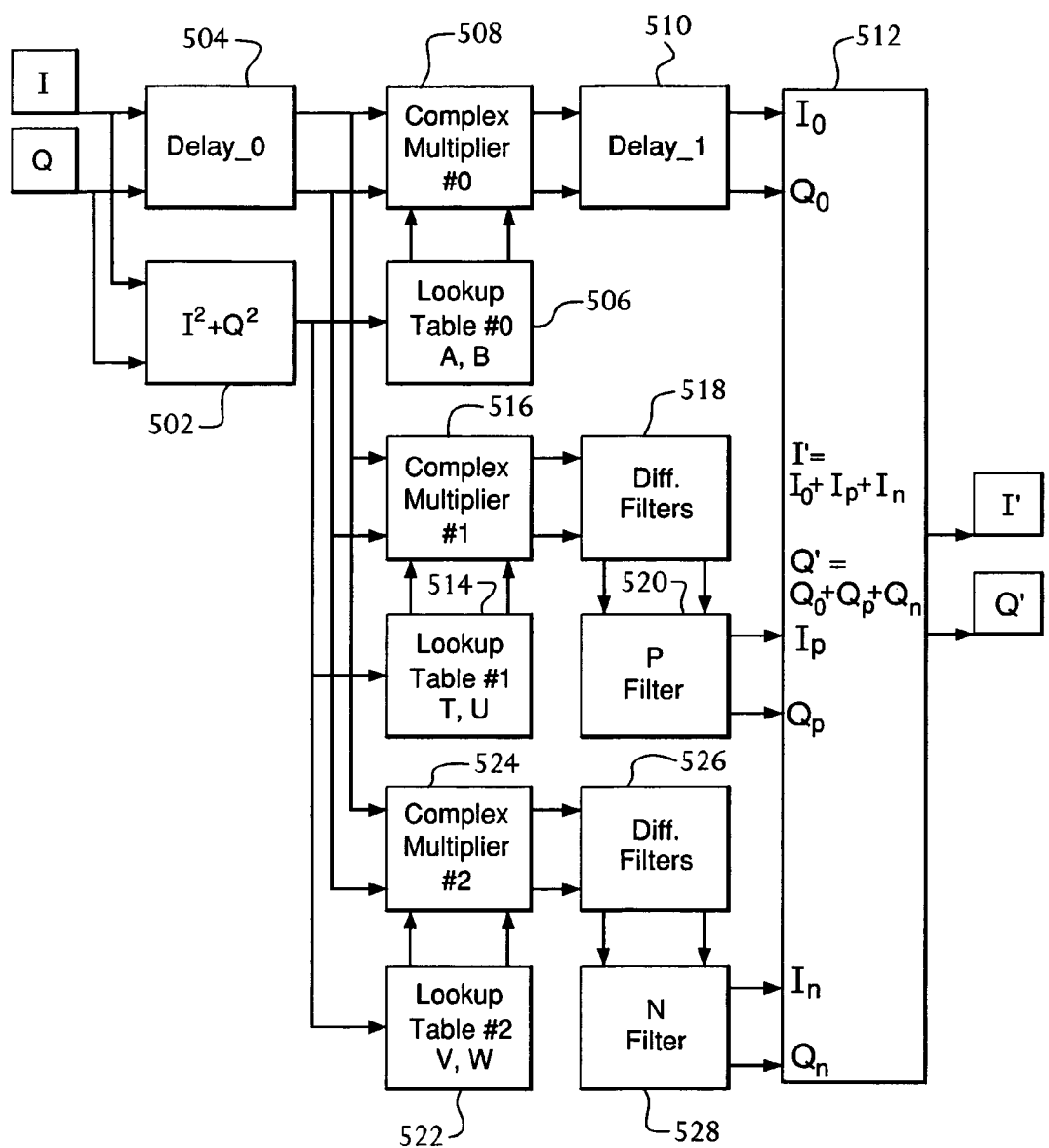
FIG. 5 shows a block diagram of a pre-distorter that uses two asymmetric filters.

Frequency-Dependent Pre-Distortion in the Baseband Domain Using Two Asymmetric Filters FIG. 5 shows a block diagram of a hardware (e.g., FPGA, ASIC, or DSP) implementation of a pre-distorter 500 that uses two asymmetric filters (520 and 528). Pre-distorter 500 corresponds to an all-digital, baseband implementation of Equation (10). In accordance with Equation (10), pre-distorter 500 generates a main (frequency-independent) pre-distortion signal as described in the '490 application (corresponding to the first term on the right-hand side of Equation (10)) and two secondary pre-distortion signals (a positive-frequency pre-distortion signal corresponding to the second term on the right-hand side of Equation (10) and a negative-frequency pre-distortion signal corresponding to the third term on the right-hand side of Equation (10)), whose magnitudes and phases are frequency-dependent. The main pre-distortion signal and the two secondary pre-distortion signals are combined to generate a pre-distorted signal for application to an amplifier. In pre-distorter 500, pre-distortion is applied to a digital input signal in the baseband domain, where differentiation and filtering are performed in the digital domain.

In particular, copies of the digital, baseband input signals (I and Q) are applied to both index-calculating module 502 and delay block 504. Index-calculating module 502 generates the digital index signal ($I^2+Q^2$) (corresponding to the power of the input signal defined by I and Q), copies of which index are applied to lookup tables 506, 514, and 522. The values A and B retrieved from lookup table 506 are multiplied by the delayed I and Q data from delay block 504 in complex multiplier 508 to generate the first term on the right-hand side of Equation (10). This complex product is applied to delay block 510, and the resulting delayed product is applied to combiner 512.

The purpose of delay blocks 504 and 510 is to ensure synchronization between the different signal paths. In particular, delay block 504 compensates for the delay incurred in index-calculating block 502, while delay block 510 compensates for the delay introduced by differentiating filters 518 and 526 and P and N filters 520 and 528.

The values T and U retrieved from lookup table 514 are multiplied by the delayed I and Q data from delay block 504 in complex multiplier 516. The resulting complex product is applied to differentiating filter 518, which differentiates the complex product with respect to time. The resulting differentiated signals are applied to positive-frequency (P) filter 520, which passes only the positive frequency components to combiner 512. The signals from P filter 520 correspond to the second term on the right-hand side of Equation (10).

Figure 6A:
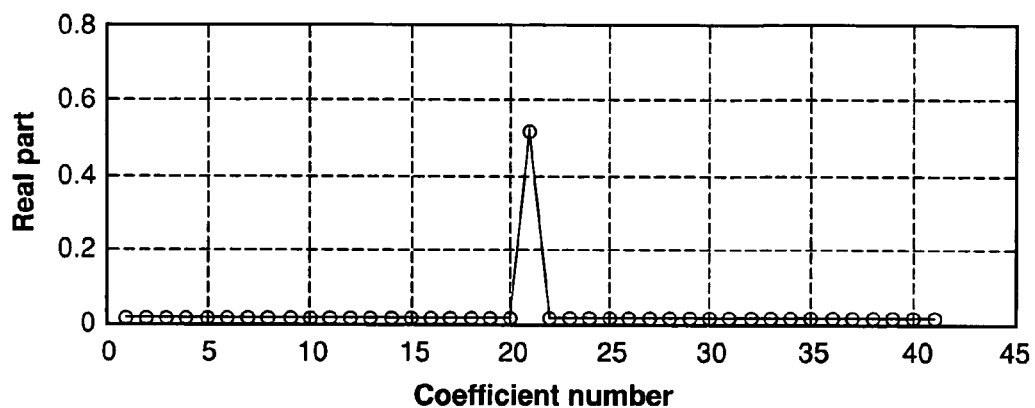
FIGS. 6A-B show the real and imaginary components of the impulse response of a representative finite impulse response (FIR) filter that passes only the positive frequency components of a signal.
Figure 6B:
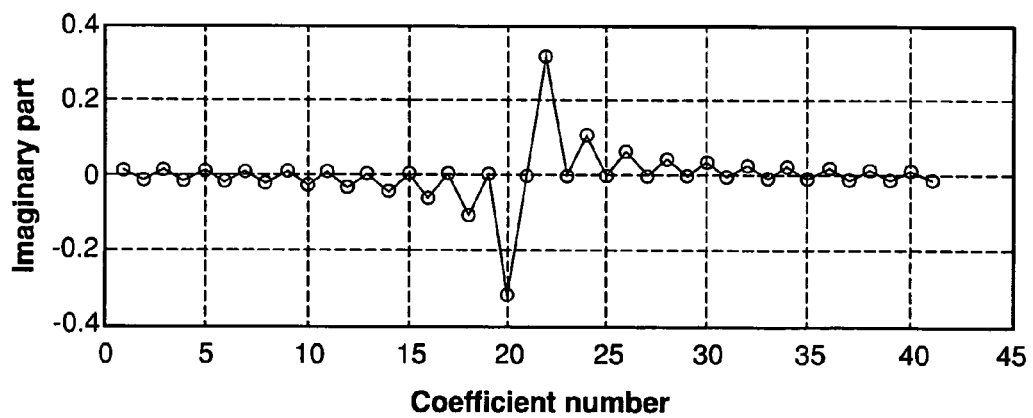

FIGS. 6A-B show the real and imaginary components of the impulse response of a representative finite impulse response (FIR) filter that passes only the positive frequency components of a signal. As such, P filter 520 can be implemented using an FIR filter based on the components of FIGS. 6A-B.

The values V and W retrieved from lookup table 522 are multiplied by the delayed I and Q data from delay block 504 in complex multiplier 524. The resulting complex product is applied to differentiating filter 526, which differentiates the complex product with respect to time. The resulting differentiated signals are applied to negative-frequency (N) filter 528, which passes only the negative frequency components to combiner 512. The signals from N filter 528 correspond to the third term on the right-hand side of Equation (10).

Figure 7A:
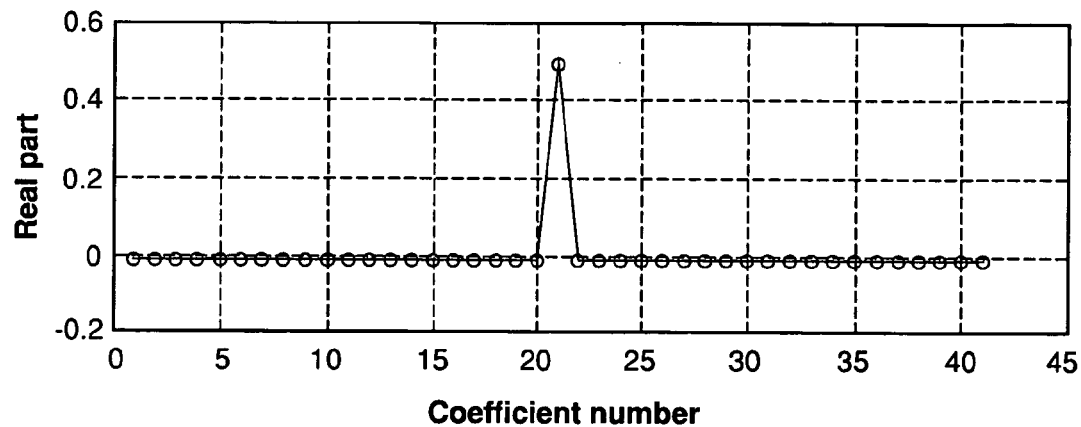
FIGS. 7A-B show the real and imaginary components of the impulse response of a representative FIR filter that passes only the negative frequency components of a signal.
Figure 7B:
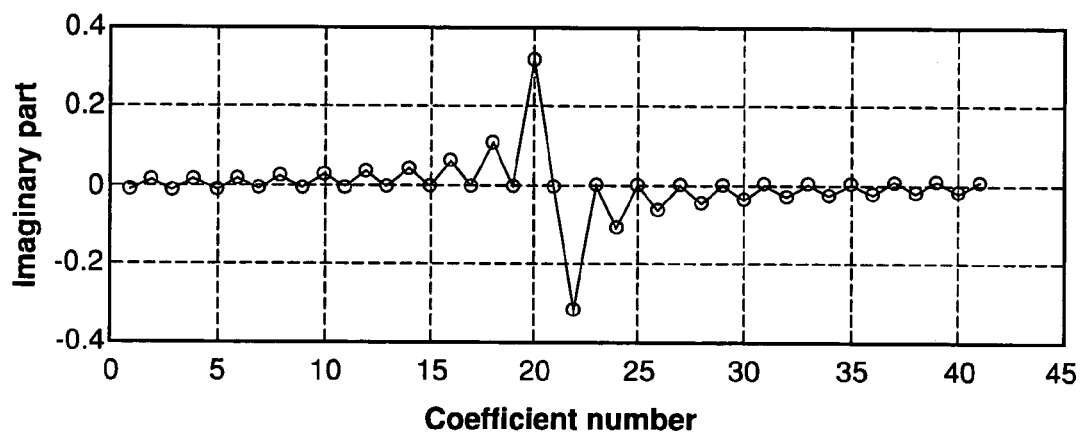

FIGS. 7A-B show the real and imaginary components of the impulse response of a representative FIR filter that passes only the negative frequency components of a signal. As such, N filter 528 can be implemented using an FIR filter based on the components of FIGS. 7A-B.

Combiner 512 combines the signals from delay block 510, P filter 520, and N filter 528 to form the digital, pre-distorted output signals (I' and Q'). The digital, pre-distorted output signals (I' and Q') can be converted using DACs to analog signals that are then applied to a conventional IQ modulator to generate an IF or RF pre-distortion signal. Alternatively, the digital outputs (I' and Q') can be converted to a digital IF signal that is then up-converted to an RF signal after digital-to-analog conversion.

In the implementation shown in FIG. 5, the parameters A, B, T, U, V, and W are shown implemented as look-up tables. Alternatively, they can be evaluated in real time by computing the values of appropriate polynomials. In either case, the coefficients used to generate these parameters may be generated and adaptively updated using the simplex algorithm.

Although FIG. 5 shows differentiating filter 518 ahead of P filter 520 and differentiating filter 526 ahead of N filter 528, either of these orders could be reversed. Alternatively, either pair of filters 518 and 520 or 526 and 528 could be implemented as a single, combined filter.

Differentiating filters 518 and 526 can be implemented in a number of ways, as described in the '289 and '446 applications. A relatively simple implementation consists of a filter with just three coefficients: [0.5, 0, −0.5].

Frequency-Dependent Pre-Distortion in the Baseband Domain Using a Single Asymmetric Filter The previous section describes pre-distorter 500, which uses two asymmetric filters 520 and 528 to implement Equation (10). This section describes pre-distorters that are implemented using only a single asymmetric filter, where one of the two asymmetric filters of pre-distorter 500 is eliminated, thereby reducing the complexity of the predistorter's hardware.

Substituting R=V−T and S=W−U into Equation (10) yields Equation (11) as follows:

$$I'+jQ'=(I+jQ)(A+jB)+d\{(I+jQ)(T+jU)\}/dt+N[d\{(I+jQ)(R+jS)\}/dt] \quad (11)$$

where T, U, R, and S are functions of the power P, and N represents an operation that passes only the negative frequency components of the spectrum.

Alternatively, substituting K=T−V and L=U−W into Equation (10) yields Equation (12) as follows:

$$I'+jQ'=(I+jQ)(A+jB)+d\{(I+jQ)(V+jW)\}/dt+P[d\{(I+jQ)(K+jL)\}/dt] \quad (12)$$

where V, W, K, and L are functions of the power P, and P represents an operation that passes only the positive frequency components of the spectrum.

Note that the second terms on the right-hand side of Equations (11) and (12) correspond to symmetrical frequency-dependent pre-distortion signals that correspond to the full set of frequency components for the input signal, while the third terms in those equations correspond to asymmetrical frequency-dependent pre-distortion signals that correspond to only a subset of the frequency components for the input signal (i.e., only the negative frequency component in the case of Equation (11) and only the positive frequency components in the case of Equation (12)).

Figure 8:
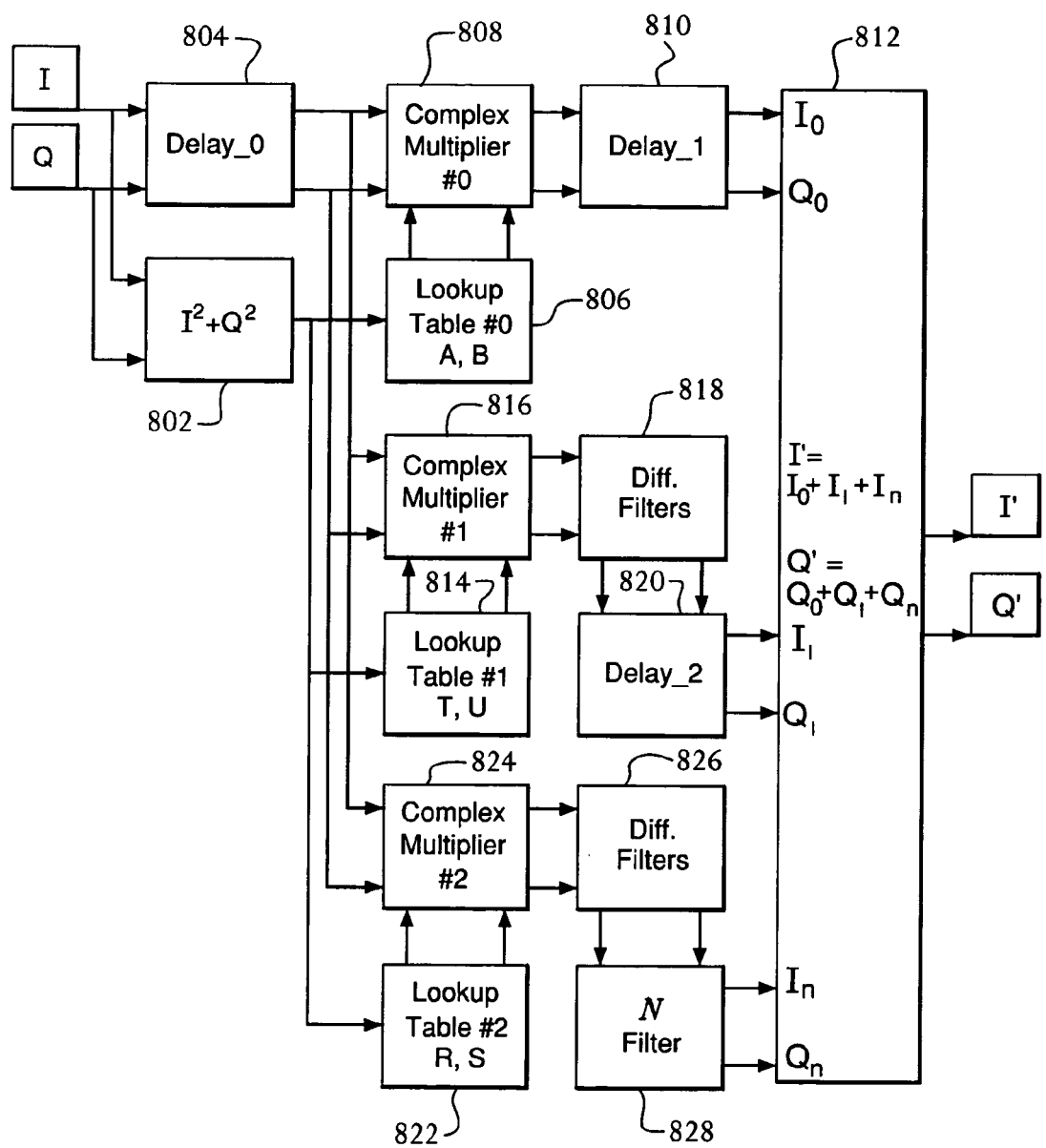
FIGS. 8-9 show block diagrams of pre-distorters that use only one asymmetric filter.

FIG. 8 shows a block diagram of a hardware (e.g., FPGA, ASIC, or DSP) implementation of a pre-distorter 800 that uses only a single asymmetric filter (828). Pre-distorter 800 corresponds to an all-digital, baseband implementation of Equation (11). In accordance with Equation (11), pre-distorter 800 generates (i) a main (frequency-independent) pre-distortion signal as described in the '490 application (corresponding to the first term on the right-hand side of Equation (11)) and (ii) two secondary pre-distortion signals (a symmetrical pre-distortion signal corresponding to the second term on the right-hand side of Equation (11) and an asymmetrical (i.e., negative-frequency) pre-distortion signal corresponding to the third term on the right-hand side of Equation (11)), where the magnitudes and phases of the two secondary pre-distortion signals are frequency-dependent. The main pre-distortion signal and the two secondary pre-distortion signals are combined to generate a pre-distorted signal for application to an amplifier. In pre-distorter 800, pre-distortion is applied to a digital input signal in the baseband domain, where differentiation and filtering are performed in the digital domain.

In particular, copies of the digital, baseband input signals (I and Q) are applied to both index-calculating module 802 and delay block 804. Index-calculating module 802 generates the digital index signal ($I^2+Q^2$) (corresponding to the power of the input signal defined by I and Q), copies of which index are applied to lookup tables 806, 814, and 822. The values A and B retrieved from lookup table 806 are multiplied by the delayed I and Q data from delay block 804 in complex multiplier 808 to generate the first term on the right-hand side of Equation (11). This complex product is applied to delay block 810, and the resulting delayed product is applied to combiner 812.

The purpose of delay blocks 804 and 810 is to ensure synchronization between the different signal paths. In particular, delay block 804 compensates for the delay incurred in index-calculating block 802, while delay block 810 compensates for the delay introduced by differentiating filters 818 and 826, delay block 820, and N filter 828.

The values T and U retrieved from lookup table 814 are multiplied by the delayed I and Q data from delay block 804 in complex multiplier 816. The resulting complex product is applied to differentiating filter 818, which differentiates the complex product with respect to time. The resulting differentiated signals are applied to delay block 820, which compensates for the delay introduced by N filter 828. The signals from delay block 820, which are passed to combiner 812, correspond to the second term on the right-hand side of Equation (11).

The values R and S retrieved from lookup table 822 are multiplied by the delayed I and Q data from delay block 804 in complex multiplier 824. The resulting complex product is applied to differentiating filter 826, which differentiates the complex product with respect to time. The resulting differentiated signals are applied to negative-frequency (N) filter 828, which passes only the negative frequency components to combiner 812. The signals from N filter 828 correspond to the third term on the right-hand side of Equation (11). N filter 828 can be implemented using an FIR filter based on the components of FIGS. 7A-B.

Combiner 812 combines the signals from delay block 810, delay block 820, and N filter 828 to form the digital, pre-distorted output signals (I' and Q'). The digital, pre-distorted output signals (I' and Q') can be converted using DACs to analog signals that are then applied to a conventional IQ modulator to generate an IF or RF pre-distortion signal. Alternatively, the digital outputs (I' and Q') can be converted to a digital IF signal that is then up-converted to an RF signal after digital-to-analog conversion.

In the implementation shown in FIG. 8, the parameters A, B, T, U, R, and S are shown implemented as look-up tables. Alternatively, they can be evaluated in real time by computing the values of appropriate polynomials. In either case, the coefficients used to generate these parameters may be generated and adaptively updated using the simplex algorithm.

Although FIG. 8 shows differentiating filter 818 ahead of delay block 820 and differentiating filter 826 ahead of N filter 828, either of these orders could be reversed. Alternatively, filters 826 and 828 could be implemented as a single, combined filter.

Differentiating filters 818 and 826 can be implemented in a number of ways, as described in the '289 and '446 applications. A relatively simple implementation consists of a filter with just three coefficients: [0.5, 0, −0.5].

Figure 9:
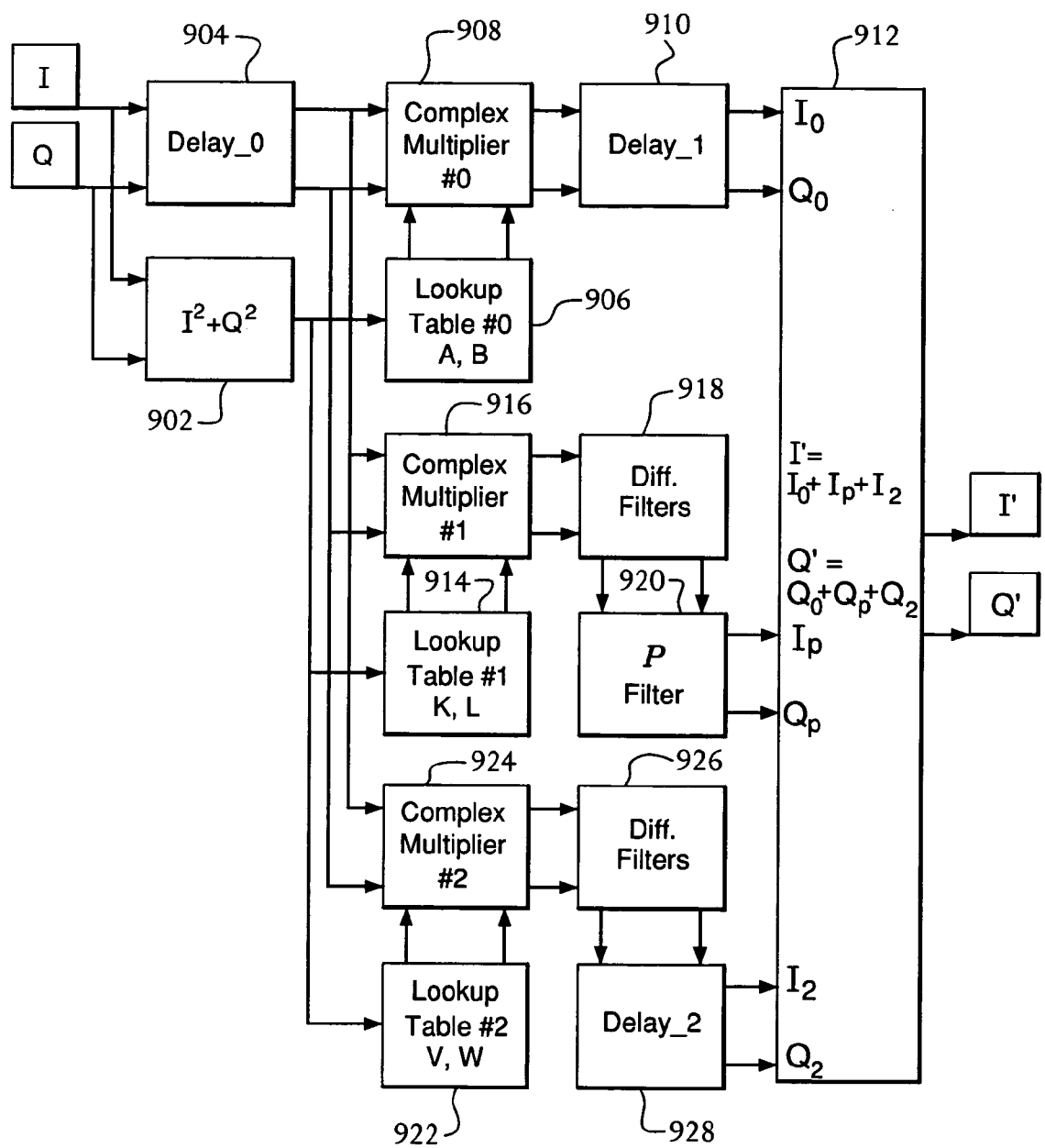

FIG. 9 shows a block diagram of a hardware (e.g., FPGA, ASIC, or DSP) implementation of a pre-distorter 900 where the single asymmetric filter is a P filter (920), instead of an N filter (828) as in FIG. 8. Pre-distorter 900 is an implementation of Equation (12) that is analogous to the implementation of Equation (11) shown in FIG. 8, where each of elements 902-928 of FIG. 9 is analogous to an element in pre-distorter 800 of FIG. 8.

ALTERNATIVE EMBODIMENTS

Depending on the particular application, the configurations shown in FIGS. 5, 8, and 9 can be implemented in the context of circuitry that includes modules analogous to equalization filter 20, clipping module 22, low-pass filter 24, and sampling module 26 of FIG. 2. In alternative implementations of the present invention, one or more—and even all—of these components may be omitted and/or one or more other processing components may be included, depending on the characteristics of the input signals and the requirements of the particular communication network.

Although the present invention has been described in the context of configurations in which frequency-dependent magnitude and phase pre-distortion of the present invention is combined with the (frequency-independent) magnitude and phase pre-distortion of the '490 application, the present invention is not so limited. In particular, it is possible to perform frequency-dependent magnitude and phase pre-distortion of the present invention without performing the pre-distortion of the '490 application. It is also possible to implement frequency-dependent magnitude pre-distortion without implementing frequency-dependent phase pre-distortion, with or without the frequency-independent pre-distortion of the '490 application.

Although the present invention has been described in the context of wireless signals transmitted from a base station to one or more mobile units of a wireless communication network, the present invention is not so limited. In theory, embodiments of the present invention could be implemented for wireless signals transmitted from a mobile unit to one or more base stations. The present invention can also be implemented in the context of other wireless and even wired communication networks to improve linearity.

Embodiments of the present invention may be implemented as circuit-based processes, including possible implementation on a single integrated circuit. As would be apparent to one skilled in the art, various functions of circuit elements may also be implemented as processing steps in a software program. Such software may be employed in, for example, a digital signal processor, micro-controller, or general-purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A method for reducing spurious emissions in an amplified signal by applying pre-distortion, whose magnitude is frequency-dependent, to an input signal to generate a pre-distorted signal, such that, when the pre-distorted signal is applied to an amplifier to generate the amplified signal, the pre-distortion reduces the spurious emissions in the amplified signal, wherein the pre-distorted signal is generated by:
   (a) generating a first frequency-dependent pre-distortion signal corresponding to a first set of frequency components for the input signal;
   (b) generating a second frequency-dependent pre-distortion signal corresponding to a second set of frequency components for the input signal, wherein the first set of frequency components is different from the second set of frequency components; and
   (c) combining the first and second frequency-dependent pre-distortion signals to generate the pre-distorted signal, wherein:
      the first set of frequency components corresponds to positive-frequency components of the input signal, wherein the positive-frequency components correspond to frequencies that are greater than a center frequency of the input signal; and
      the second set of frequency components corresponds to negative-frequency components of the input signal, wherein the negative-frequency components correspond to frequencies that are smaller than the center frequency of the input signal.

2. The method of claim 1, wherein the phase of the pre-distortion is also frequency-dependent.

3. The method of claim 1, wherein:
   the first frequency-dependent pre-distortion signal is generated by:
      (1) generating a first set of one or more waveforms corresponding to a first set of one or more pre-distortion parameters;

(2) differentiating the first set of one or more waveforms with respect to time, to generate a first set of one or more differentiated waveforms; and (3) applying the first set of one or more differentiated waveforms to a positive-frequency operation to generate the first frequency-dependent pre-distortion signal; and the second frequency-dependent pre-distortion signal is generated by:

(1) generating a second set of one or more waveforms corresponding to a second set of one or more pre-distortion parameters;

(2) differentiating the second set of one or more waveforms with respect to time to generate a second set of one or more differentiated waveforms; and (3) applying the second set of one or more differentiated waveforms to a negative-frequency operation to generate the second frequency-dependent pre-distortion signal.

4. The method of claim 1, further comprising the step of generating a frequency-independent pre-distorted signal from the input signal, wherein the frequency-independent pre-distorted signal and the first and second frequency-dependent pre-distortion signals are combined to generate the pre-distorted signal.

5. The method of claim 1, wherein:
the input signal is represented in a base-band domain; and
the first and second frequency-dependent pre-distortion signals are generated in a digital domain.

6. An apparatus for applying pre-distortion to an input signal to generate a pre-distorted signal, such that, when the pre-distorted signal is applied to an amplifier to generate an amplified signal, the pre-distortion reduces spurious emissions in the amplified signal, the apparatus comprising:

(a) a first signal processing path adapted to generate a main pre-distortion signal from the input signal;

(b) a second signal processing path adapted to generate a first frequency-dependent pre-distortion signal corresponding to a first set of frequency components for the input signal;

(c) a third signal processing path adapted to generate a second frequency-dependent pre-distortion signal corresponding to a second set of frequency components for the input signal, wherein frequencies of the first set of frequency components are different from frequencies of the second set of frequency components; and (d) a combiner adapted to combine the first and second frequency-dependent pre-distortion signals with the main pre-distortion signal to generate the pre-distorted signal.

7. The apparatus of claim 6, wherein:
the first set of frequency components corresponds to positive-frequency components of the input signal, wherein the positive-frequency components correspond to frequencies that are greater than a center frequency of the input signal; and
the second set of frequency components corresponds to negative-frequency components of the input signal, wherein the negative-frequency components correspond to frequencies that are smaller than the center frequency of the input signal.

8. The apparatus of claim 7, wherein:
the first frequency-dependent pre-distortion signal is generated by:

(1) generating a first set of one or more waveforms corresponding to a first set of one or more pre-distortion parameters;

(2) differentiating the first set of one or more waveforms with respect to time to generate a first set of one or more differentiated waveforms; and (3) applying the first set of one or more differentiated waveforms to a positive-frequency operation to generate the first frequency-dependent pre-distortion signal; and the second frequency-dependent pre-distortion signal is generated by:

(1) generating a second set of one or more waveforms corresponding to a second set of one or more pre-distortion parameters;

(2) differentiating the second set of one or more waveforms with respect to time to generate a second set of one or more differentiated waveforms; and (3) applying the second set of one or more differentiated waveforms to a negative-frequency operation to generate the second frequency-dependent pre-distortion signal.

9. The apparatus of claim 8, wherein the positive-frequency and negative-frequency operations are implemented using filters.

10. The apparatus of claim 6, wherein:
the first set of frequency components corresponds to positive-frequency components and negative-frequency components of the input signal;
the second set of frequency components corresponds to only positive-frequency components or only negative-frequency components of the input signal;
the positive-frequency components correspond to frequencies that are greater than a center frequency of the input signal; and
the negative-frequency components correspond to frequencies that are smaller than the center frequency of the input signal.

11. The apparatus of claim 10, wherein:
the first frequency-dependent pre-distortion signal is generated by:

(1) generating a first set of one or more waveforms corresponding to a first set of one or more pre-distortion parameters;

(2) differentiating the first set of one or more waveforms with respect to time to generate the first frequency-dependent pre-distortion signal; and the second frequency-dependent pre-distortion signal is generated by:

(1) generating a second set of one or more waveforms corresponding to a second set of one or more pre-distortion parameters;

(2) differentiating the second set of one or more waveforms with respect to time to generate a second set of one or more differentiated waveforms; and (3) applying the second set of one or more differentiated waveforms to a negative-frequency operation or a positive-frequency operation to generate the second frequency-dependent pre-distortion signal.

12. The apparatus of claim 11, wherein the positive-frequency operation or the negative-frequency operation is implemented using a filter.

13. The apparatus of claim 6, wherein:
the input signal is represented in a base-band domain; and
the main pre-distortion signal and the first and second frequency-dependent pre-distortion signals are generated in a digital domain.

14. The apparatus of claim 6, wherein:
the first signal processing path comprises:
- (1) an index generator adapted to generate index values proportional to envelope power of the input signal;
- (2) a first look-up table adapted to provide first and second pre-distortion parameters using the index values; and
- (3) a first multiplier adapted to multiply the input signal by the first and second pre-distortion parameters to generate the main pre-distortion signal;

the second signal processing path comprises:
- (1) a second look-up table adapted to provide third and fourth pre-distortion parameters using the index values;
- (2) a second multiplier adapted to multiply the input signal by the third and fourth pre-distortion parameters to generate first multiplied signals; and
- (3) a first differentiator adapted to differentiate the first multiplied signals with respect to time to generate first differentiated signals; and the third signal processing path comprises:
- (1) a third look-up table adapted to provide fifth and sixth pre-distortion parameters using the index values;
- (2) a third multiplier adapted to multiply the input signal by the fifth and sixth pre-distortion parameters to generate second multiplied signals; and
- (3) a second differentiator adapted to differentiate the second multiplied signals with respect to time to generate second differentiated signals.

15. The apparatus of claim 14, wherein:
the second signal processing path further comprises a positive-frequency filter adapted to filter the first differentiated signals to generate the first frequency-dependent predistortion signal; and
the third signal processing path further comprises a negative-frequency filter adapted to filter the second differentiated signals to generate the second frequency-dependent predistortion signal.

16. The apparatus of claim 14, wherein:
the first differentiated signals are the first frequency-dependent predistortion signal; and
the third signal processing path further comprises either a positive-frequency filter or a negative-frequency filter adapted to filter the second differentiated signals to generate the second frequency-dependent predistortion signal.

17. A method for reducing spurious emissions in an amplified signal by applying pre-distortion, whose magnitude is frequency-dependent, to an input signal to generate a pre-distorted signal, such that, when the pre-distorted signal is applied to an amplifier to generate the amplified signal, the pre-distortion reduces the spurious emissions in the amplified signal, wherein the pre-distorted signal is generated by:
- (a) generating a first frequency-dependent pre-distortion signal corresponding to a first set of frequency components for the input signal;
- (b) generating a second frequency-dependent pre-distortion signal corresponding to a second set of frequency components for the input signal, wherein the first set of frequency components is different from the second set of frequency components; and
- (c) combining the first and second frequency-dependent pre-distortion signals to generate the pre-distorted signal, wherein:
  - the first set of frequency components corresponds to positive-frequency components and negative-frequency components of the input signal;
  - the second set of frequency components corresponds to only positive-frequency components or only negative-frequency components of the input signal;
  - the positive-frequency components correspond to frequencies that are greater than a center frequency of the input signal; and
  - the negative-frequency components correspond to frequencies that are smaller than the center frequency of the input signal.

18. The method of claim 17, wherein the phase of the pre-distortion is also frequency-dependent.

19. The method of claim 17, wherein:
the first frequency-dependent pre-distortion signal is generated by:
- (1) generating a first set of one or more waveforms corresponding to a first set of one or more pre-distortion parameters;
- (2) differentiating the first set of one or more waveforms with respect to time to generate the first frequency-dependent pre-distortion signal; and the second frequency-dependent pre-distortion signal is generated by:
- (1) generating a second set of one or more waveforms corresponding to a second set of one or more pre-distortion parameters;
- (2) differentiating the second set of one or more waveforms with respect to time to generate a second set of one or more differentiated waveforms; and
- (3) applying the second set of one or more differentiated waveforms to a negative-frequency operation or a positive-frequency operation to generate the second frequency-dependent pre-distortion signal.

20. The method of claim 17, further comprising the step of generating a frequency-independent pre-distorted signal from the input signal, wherein the frequency-independent pre-distorted signal and the first and second frequency-dependent pre-distortion signals are combined to generate the pre-distorted signal.

21. The method of claim 17, wherein:
the input signal is represented in a base-band domain; and
the first and second frequency-dependent pre-distortion signals are generated in a digital domain.

* * * * *